United States Patent [19]

Wetzel et al.

[11] Patent Number: 4,862,094
[45] Date of Patent: Aug. 29, 1989

[54] STROBOSCOPIC LIGHT CIRCUIT DIAGNOSTIC SYSTEM

[75] Inventors: Donald C. Wetzel, Berea; Robert A. Livsey, Richmond Heights, both of Ohio

[73] Assignee: Meg Trans Corp., Berea, Ohio

[21] Appl. No.: 69,649

[22] Filed: Jul. 6, 1987

[51] Int. Cl.⁴ .................................. G01R 31/00
[52] U.S. Cl. ............................ 324/500; 324/502; 324/512; 324/556; 324/133
[58] Field of Search ............... 324/133, 500, 502, 509, 324/512, 555, 556, 414, 403

[56] References Cited

U.S. PATENT DOCUMENTS 4,346,375  8/1982  Billings ........................... 324/133 X
4,394,647  7/1983  Van Dine ....................... 324/133 X
4,730,163  3/1988  Santos ............................ 324/414

Primary Examiner—Reinhard J. Eisenzopf
Assistant Examiner—Robert W. Mueller
Attorney, Agent, or Firm—Pearne, Gordon, McCoy & Granger

[57] ABSTRACT

The self-contained diagnostic system is provided for a stroboscopic light circuit. The diagnostic system includes a plurality of signal lights, preferably LEDs, connected at various locations in the circuit to provide a visual indication of the faulty portion of the circuit in the event that the circuit does not operate properly. The system provides a quick and easy method for determining the location of a malfunction of a stroboscopic light without the necessity of replacing the entire light system or the use of diagnostic equipment.

6 Claims, 1 Drawing Sheet

STROBOSCOPIC LIGHT CIRCUIT DIAGNOSTIC SYSTEM

BACKGROUND OF THE INVENTION

1. Field of the Invention

This invention relates to circuits for the operation of stroboscopic or flashing lights, such as those used in warning light systems, photography, and the like, and in particular to a diagnostic system incorporated into the stroboscopic light circuit for indicating failure of any portion of the circuit.

2. Description of the Prior Art

Flashing lights known as stroboscopic or "strobe" lights are used in a variety of applications, principally as visual warning lights, such as atop moving vehicles, as illuminating devices in photography, and as measuring and testing devices such as in machine revolution counting. The typical stroboscopic light circuit comprises a flash lamp and a source of high-voltage electricity to operate the flash lamp, with a trigger impulse being provided to trigger the illumination of the flash lamp.

The circuit typically comprises a series of component parts. The first portion of the circuit is the electrical voltage supply source. The second portion of the circuit is a fuse connected to the voltage supply source. The third portion is an electrical high-voltage transient filter connected to the voltage supply source to provide a filtered power supply. The fourth portion is a high-voltage power supply. The fifth portion is the flash lamp itself.

Stroboscopic light circuits, as with all devices, are subject to failure. A failure can occur in any of the portions of the circuit previously described, and the location of the failure could only be determined by substitution of the individual portions of the circuit, or through the use of various diagnostic instruments which are costly and which require operation by a skilled technician. These problems were particularly acute in stroboscopic light circuits used to operate visual warning devices, such as those installed as flashing light signals on moving vehicles or atop high towers. In these instances, the light system usually had to be removed from service and taken to a repair area. This practice was time-consuming and sometimes left the installation location without the benefit of a warning light system. To avoid the problem of not having a warning light at the installation location while the repair was taking place, a replacement light system could be temporarily installed. However, this practice was even more expensive because it required replacing the light system twice.

Devices to test the operation of flashing light circuits have been disclosed in U.S. Pat. Nos. 2,901,692, issued to Polhemus, and 3,701,942, issued to Kobayashi et al. In the patent to Kobayashi et al., the entire flash circuit was tested by connecting a test circuit to the flash circuit. The test circuit included an indicating lamp and a test switch, so that when the test switch was closed, the indicating lamp indicated the operation of the flash circuit. However, the device of Kobayashi et al. failed to provide an indication of the location of any failure in the circuit, so that it would not be possible to determine where in the circuit the failure had occurred and to take the appropriate corrective action to repair the circuit and return it to operation.

Various other diagnostic indication systems have been proposed, such as those disclosed in U.S. Pat. Nos. 2,382,647, issued to McLoughlin et al., 3,686,531, issued to Decker et al., 3,840,801, issued to Kellogg et al., and 4,282,479, issued to Deboo et al. However, none of these patents indicate how a diagnostic system may be incorporated into a stroboscopic light circuit to provide the necessary diagnostics to immediately indicate the source of any failure in the circuit.

SUMMARY OF THE INVENTION

The disadvantages and limitations of the prior art are overcome by the present invention of a diagnostic system for a stroboscopic light circuit. The diagnostic system of the present invention provides a pattern of individually illuminated and extinguished indicating light signals which immediately tell the operator which portion of the stroboscopic control circuit is faulty. Thus, the diagnostic system of the present invention allows a maintenance person to pinpoint exactly what portion of the light circuit is causing the faulty operation of the stroboscopic light and to repair or replace that portion of the circuit so that the light system can be immediately returned to operation. The present invention avoids the necessity of replacing the entire stroboscopic light system upon failure of any individual portion of the system because the faulty portion of the system may be replaced quickly and easily. The present invention also makes possible the speedy repair of an inoperative stroboscopic light circuit without the necessity of removing the light system and returning it to a repair area in order to perform needed diagnostic tests.

These and other advantages are achieved by the present invention of a diagnostic system for a stroboscopic light circuit having a flash lamp. The system comprises an operating voltage source and a first indicating signal light connected to the operating voltage source for indicating the proper functioning of the operating voltage source. The system also comprises means connected to the operating voltage source for providing a high-voltage power supply to the flash lamp and a second indicating signal light connected to the means for providing the high-voltage power supply for indicating the proper functioning of the high-voltage power supply. The system also comprises means for providing a trigger impulse to actuate the flash lamp and time delay means connected to the means for providing the trigger impulse signal. The time delay means provides a signal coincident with the trigger impulse signal and of longer duration. A third indicating light is connected to the time delay means for indicating the proper functioning of the trigger impulse signal.

In accordance with another aspect of the present invention, many stroboscopic light circuits also contain fuses and/or filters. In such circuits, the present invention would also include a fuse connected to the operating voltage source, and a fourth indicating signal light connected to the fuse for indicating the proper functioning of the fuse. The system may also comprise a transient filter connected to the fuse for providing a filtered power supply, and a fifth indicating signal light connected to the filter for indicating the proper functioning of the filter.

DETAILED DESCRIPTION OF THE PREFERRED EMBODIMENT

Figure 1:
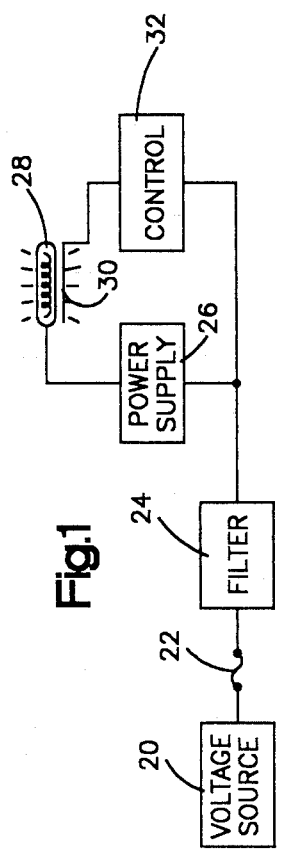
FIG. 1 is a schematic block diagram showing the location of the diagnostic system of the present invention.

Referring more particularly to the drawings, and initially to FIG. 1, there is shown a block diagram indicating the elements of a stroboscopic flash signal system such as is used on a moving vehicle such as an emergency motor vehicle or a railroad locomotive. The system includes a voltage source 20, which in the case of a vehicle system is typically a low-voltage DC power supply. In an automobile or emergency motor vehicle, a 12-volt power source is typical. In a locomotive, a 74-volt DC power source is typical. The voltage source 20 is typically connected to a fuse 22, which is in turn connected to an electrical, high-voltage, transient filter 24. The fuse 22 and the filter 24 are not used in all systems.

The output of the voltage source 20, which may be supplied through the fuse 22 and the filter 24, is supplied to a high-voltage power supply circuit 26. The high-voltage power supply circuit 26 typically includes a transformer and power supply control components to supply the necessary high-voltage to illuminate a flash lamp 28. The flash lamp 28 may be a typical neon or xenon flash tube as used in stroboscopic light systems which flashes when it receives a signal at a trigger input 30. The output of the voltage source 20 is also supplied through the fuse 22 and the filter 24 to a control circuit 32 which may selectively supply a short-duration impulse at regular intervals to the trigger control 30 of the flash lamp 28.

Figure 2:
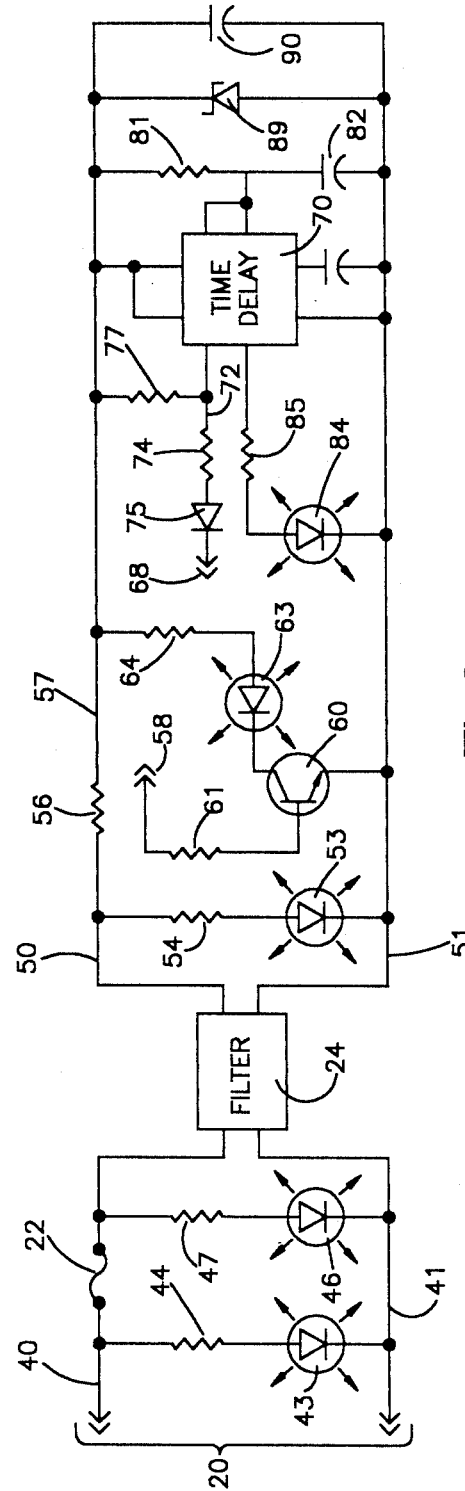
FIG. 2 is an electrical, schematic diagram showing the diagnostic system of FIG. 1.

The diagnostic system of the present invention for use with the stroboscopic light circuit of FIG. 1 is shown in FIG. 2. As shown in FIG. 2, the DC voltage source 20 supplies a voltage line 40 and a common line or "ground" 41. A light-emitting diode (LED) 43 is connected in series with a resistor 44 between the lines 40 and 41 from the voltage source 20. The LED 43 provides a visual indication that the voltage source 20 is functioning properly. When the DC voltage source 20 is functioning properly, the LED 43 is illuminated.

The voltage line 40 from the DC voltage source 20 is connected to a slow-blow fuse 22, typically for 1 ampere. An LED 46 is connected in series with a resistor 47 between the fuse 22 and the common line 41. When the fuse 22 is blown, or is otherwise inoperative, the LED 46 does not light. When the fuse 22 is operating properly and the voltage source 20 is providing proper electrical power, the LED 46 is illuminated.

The output of the fuse 22, along with the common line 41 from the voltage source 20, are connected to the electrical high-voltage, transient filter 24. The output of the filter 24 provides a voltage line 50 with the same voltage as from the DC voltage source 20 and a common or ground line 51. An LED 53 is connected in series with a resistor 54 between the voltage line 50 and the common line 51. The LED 53 is illuminated when the voltage source 20, the fuse 22, and the filter 24 are all operating properly. If the filter 24 does not operate properly, or if the voltage source 20 or the fuse 22 are inoperative, the LED 53 does not light.

The resistance values of the resistors 44, 47, and 54 depend upon the voltage level from the voltage source 20. In systems in which a 74-volt DC voltage source is provided, such as in railroad locomotives, each of the resistors 44, 47, and 54 should be a 7.5 kilohm resistor with a power rating of 1 watt. In a typical emergency flash system, such as those used in an automobile having a supply of 12 volts DC, the resistors 44, 47, and 54 should be 1 kilohm, 0.25 watt.

The output of the filter 24 is typically connected to a high-voltage power circuit 26, as shown in FIG. 1, which is used to supply power to the flash lamp 28. The high-voltage power supply is also connected to the diagnostic system of FIG. 2 by means of a connection 58, which is connected to the base of a switching transistor 60 through a resistance element 61. The resistor 61 should be 1 megohm (with a power rating of 0.5 watts) to protect the lower voltage diagnostic system. An LED 63 is connected in series with a resistor 64 to the collector terminal of the transistor 60. The emitter terminal of the transistor 60 is connected to the common line 51. When high voltage is supplied from the high-voltage supply circuit through the connection 58, it switches on the transistor 60 to illuminate the LED 63. If the high-voltage circuit does not function, the necessary voltage is not supplied from the connection 58 to the base of the transistor 60, so that the transistor 60 is switched off and the LED 68 will not light up.

If a voltage source 20 is used which supplies 74 volts DC power, it is desirable to reduce the power supply to 12 volts DC, so that a voltage-level reducing resistor 56 is provided in the voltage line 50. The resistor 56 reduces the DC voltage supply from the 74 volts on the line 50 to 12 volts on a line 57. The value of the resistor 56 to accomplish this voltage reduction should be about 2 kilohms, with a power rating of 10 watts. If the diagnostic system of the present invention is used with a voltage source 20, supplying 12 volts DC, the resistor 56 may be unnecessary.

As shown in FIG. 1, the flash lamp 28 is triggered by a signal received on a trigger line 30 from the control circuit 32. The trigger line 30 is also connected to the diagnostic system through a connection 68. The connection 68 is connected to a timer in the form of a time delay unit 70 by a line 72. The time delay unit 70 may be, for example, a general purpose IC timer, commonly designated a "555" unit. The time delay unit 70 is supplied with power from the voltage line 57 and common line 51. A resistor 74 (1.5 megohms, 0.5 watts) and a diode 75 are provided on the line 72. A resistor 77 (100 kilohms, 0.5 watts) is connected between the voltage line 57 and the trigger line 72.

An LED 84 is connected in series with a resistor 85 between the output of the time delay unit 70 and the common line 51. A time delay unit comprising the general purpose timer of the "555" type provides an extended duration output from a triggered input on line 72. The duration of the extended output is determined by the RC circuit comprising a resistor 81 and a capacitor 82 connected to both the threshold and discharge inputs of the time delay unit 70. Suitable results can be achieved using a resistor 81 with a resistance of 100 kilohms and a capacitor 82 with a capacitance of 1 microfarad. If the values of the resistor 81 and the capacitor 82 are properly selected, the time delay unit 70 provides an extended duration output to the LED 84 so that illumination of the LED 84 may be observed. If the LED 84 were connected directly to the trigger output 72, it would be very difficult to determine if the LED was illuminating because the trigger output supplied on the line 72 from the trigger connection 68 is of such a short duration that it would cause the LED 84 to illuminate very briefly, and possibly the illumination of the LED 84 would be visually undetectable. By utilizing the time delay capabilities of the time delay unit 70, it is possible to increase the duration of the trigger impulses so that the LED 84 may be illuminated for a longer duration during each flash. As a result, it is possible to visually determine if the trigger pulses being sent to the flash tube are operating by observing if the LED 84 illuminates, since each trigger output on the line 72 will also cause a longer duration impulse to be sent to the LED 84.

To maintain the voltage line 57 at a constant 12 volts without regard to transients and variations in load current and against transients and variations in the voltage supply, a Zener diode 89 is connected in parallel with a capacitor 90 between the common line 51 and the voltage line 57. The capacitor 90 may have a capacitance of 22 microfarads.

The placement and location of the LEDs 43, 46, 53, 63, and 84 are such that the illumination or non-illumination of all or some of the LEDs provide an immediate indication to the operator of any malfunction in the stroboscopic light control circuit. If the circuit is operating properly, the LEDs 43, 46 53, and 63 are constantly illuminated, and the LED 84 is blinking on and off. If none of the LEDs are illuminated, the cause of the failure must be the voltage source 20, since none of the circuit is receiving a proper power supply. If only the LED 43 is illuminated, and all of the other LEDs do not light up, the cause of the failure must be the fuse 22. If only the LEDs 43 and 46 are illuminated, and none of the other LEDs light up, the cause of the failure must be the filter 24. If only the LEDs 43, 46, and 53 are illuminated, and the LEDs 63 and 84 are not illuminated, the failure must be in the high-voltage power supply circuit 26 connected to the connection 58. If all of the LEDs 43, 46, 53, 63, and 84 are illuminated, but the flash lamp 28 is not lighting, the flash lamp itself is inoperative and should be replaced. Thus, the LEDs give a visual indication of the proper operation of each portion of the stroboscopic light circuit, and the operator can easily and quickly determine which portion of the circuit is not operating properly without the use of any external testing instruments. Thus, in servicing the stroboscopic light system, the operator can simply replace the defective component based upon the indications given to him by the diagnostic system and return the stroboscopic light back to operation within a very short period of time.

While the invention has been shown and described with respect to a particular embodiment thereof, this is for the purpose of illustration rather than limitation, and other variations and modifications of the specific embodiment herein shown and described will be apparent to those skilled in the art all within the intended spirit and scope of the invention. Accordingly, the patent is not to be limited in scope and effect to the specific embodiment herein shown and described, nor in any other way that is inconsistent with the extent to which the progress in the art has been advanced by the invention.

What is claimed is:

1. A diagnostic stroboscopic light circuit having a flash lamp comprising:
   an operating voltage source;
   a first indicating light connected to the operating voltage source for indicating that the operating voltage source is providing a supply of voltage;
   means connected to the operating voltage source for providing a high-voltage power supply to the flash lamp;
   a second indicating light connected to the means for providing the high-voltage power supply for indicating that power is being supplied from the high-voltage power supply;
   means for providing a trigger impulse signal to actuate the flash lamp;
   time delay means connected to the means for providing the trigger impulse signal, the time delay means providing a signal coincident with the trigger impulse signal and of a longer duration which is visually perceptible; and
   a third indicating light connected to the time delay means for indicating that the trigger impulse signal has been provided from the means for providing the trigger impulse signal;
   the first, second and third signal indicating lights together providing an array uniquely indicating the operating status of the stroboscopic light circuit.

2. A diagnostic stroboscopic light circuit as defined in claim 1, comprising in addition:
   a fuse connected to the operating voltage source; and
   a fourth indicating light connected to the fuse for indicating that the fuse has not interrupted the supply of power from the operating voltage source;
   the fourth indicating light together with the first, second and third indicating lights providing an array uniquely indicating the operating status of the stroboscopic light circuit.

3. A diagnostic stroboscopic light circuit as defined in claim 1, comprising in addition:
   a transient filter connected to the operating voltage source for providing a filtered power supply; and
   a fourth indicating light connected to the filter for indicating that the filter is supplying a filtered power supply;
   the fourth indicating light together with the first, second and third indicating lights providing an array uniquely indicating the operating status of the stroboscopic light circuit.

4. A diagnostic stroboscopic light circuit as defined in claim 3, comprising in addition:
   a fuse connected to the operating voltage source; and
   a fifth indicating light connected to the fuse for indicating that the fuse has not interrupted the supply of power from the operating voltage source;
   the fifth indicating light together with the first, second, third and fourth indicating lights providing an array uniquely indicating the operating status of the stroboscopic light circuit.

5. A diagnostic stroboscopic light circuit having a flash lamp comprising:
   an operating voltage source;
   a first indicating signal light connected to the operating voltage source for indicating that the operating voltage source is providing a supply of voltage;
   a fuse connected to the operating voltage source;
   a second indicating signal light connected to the fuse for indicating that the fuse has not interrupted the supply of power from the operating voltage source;
   a transient filter connected to the fuse for providing a filtered power supply;
   a third indicating signal light connected to the filter for indicating that the filter is supplying a filtered power supply;

means connected to the filter for providing a high-voltage power supply to the flash lamp;
a fourth indicating signal light connected to the means for providing the high-voltage power supply for indicating that power is being supplied from the high-voltage power supply;
means for providing a trigger impulse signal to actuate the flash lamp;
time delay means connected to the means for providing the trigger impulse signal, the time delay means providing a signal coincident with the trigger impulse signal and of a longer duration which is visually perceptible; and
a fifth indicating signal light connected to the time delay means for indicating that the trigger impulse signal has been provided from the means for providing the trigger impulse signal;
the first, second, third, fourth and fifth indicating signal lights together providing an array uniquely indicating the operating status of the stroboscopic light circuit.

6. A diagnostic stroboscopic flash light circuit having a flash lamp, comprising:
an operating voltage source providing a voltage line and a common line;
a first indicating signal light connected between the voltage line and the common line for indicating that the operating voltage source is providing a supply of voltage;
a fuse connected to the voltage line and having a fused voltage output provided on a fused voltage line;
a second indicating signal light connected between the fused voltage line and the common line for indicating that the fuse has not interrupted the supply of power from the operating voltage source;
a transient filter connected to the fused voltage line and the common line and having an output provided on a filtered voltage line and a filtered common line;
a third indicating signal light connected between the filtered voltage line and the filtered common line for indicating that the filter is supplying a filtered power supply;
means connected to the filtered voltage line and the filtered common line for providing a high-voltage power supply to operate the flash lamp;
switch means connected between the filtered voltage line and filtered common line, said switch means being operated by voltage from the high-voltage power supply;
a fourth indicating signal light connected between the filtered voltage line and the switch line for indicating that power is being supplied from the high-voltage power supply;
control means for providing trigger impulse signals to the flash lamp to actuate the flash lamp;
time delay means connected to the control means for providing a signal coincident with the trigger impulse signal and of a longer duration which is visually perceptible; and
a fifth indicating signal light connected to the time delay means for indicating that the trigger impulse signal has been provided from the means for providing the trigger impulse signal;
the first, second, third, fourth and fifth indicating signal lights together providing an array uniquely indicating the operating status of the stroboscopic light circuit.

* * * * *